United States Patent [19]

Sindzingre et al.

[11] Patent Number: 5,722,581
[45] Date of Patent: Mar. 3, 1998

[54] METHOD AND DEVICE FOR WAVE SOLDERING INCORPORATING A DRY FLUXING OPERATION

[75] Inventors: Thierry Sindzingre, Cachan; Stéphane Rabia, Gif sur Yvette; Nicolas Potier, Paris, all of France

[73] Assignee: L'Air Liquide, Societe Anonyme pour l'Etude et l'Exploitation des Procedes George Claude, Paris, France

[21] Appl. No.: 655,206

[22] Filed: Jun. 7, 1996

[30] Foreign Application Priority Data

Jun. 9, 1995 [FR] France .................... 95 06818

[51] Int. Cl.⁶ .................................................. B23K 1/20
[52] U.S. Cl. ........................ 228/206; 228/219; 228/42; 156/345; 134/1.1; 216/67
[58] Field of Search ................... 228/180.21, 205, 228/206, 219, 220, 223, 42; 156/345; 204/157.15, 164, 176; 118/23 ER; 427/534; 213/13, 52, 67; 134/1, 1.1

[56] References Cited

U.S. PATENT DOCUMENTS

| | | | |
|---|---|---|---|
| 4,273,859 | 6/1981 | Mones et al. | 228/180.21 |
| 5,090,609 | 2/1992 | Nakao et al. | 228/123.1 |
| 5,192,582 | 3/1993 | Liedke et al. | 228/206 |
| 5,255,840 | 10/1993 | Nowotarski | 228/254 |
| 5,458,856 | 10/1995 | Marie et al. | 204/176 |
| 5,525,204 | 6/1996 | Shurboff et al. | 228/180.22 |

FOREIGN PATENT DOCUMENTS

| | | |
|---|---|---|
| 427 020 | 5/1991 | European Pat. Off. |
| 658 391 | 6/1995 | European Pat. Off. |
| 2 683 114 | 5/1993 | France. |
| 2 692 730 | 12/1993 | France. |

*Primary Examiner*—Samuel M. Heinrich
*Attorney, Agent, or Firm*—Burns, Doane, Swecker & Mathis, LLP

[57] ABSTRACT

A method for wave soldering a circuit having two or more faces comprising the steps of:

(i) passing at least one initial gas mixture comprising at least one of an inert gas, a reducing gas and an oxidizing gas into at least one apparatus for forming excited or unstable gas species;

(ii) converting the at least one initial gas mixture into at least one primary gas mixture comprising excited or unstable gas species and substantially free of electrically charged species;

(iii) treating each of the two or more faces of the circuit with the at least one primary gas mixture at a pressure close to atmospheric pressure; and (iv) contacting the two or more faces of the circuit with at least one wave of a liquid soldering alloy.

33 Claims, 3 Drawing Sheets

METHOD AND DEVICE FOR WAVE SOLDERING INCORPORATING A DRY FLUXING OPERATION

BACKGROUND OF THE INVENTION

(i) Field of the Invention

The present invention relates to the operations of soldering in electronics. It is thus applicable, in particular, to the operations:

- of wave-soldering components onto a circuit (both in the case of inserted components and surface-mounted components),
- of wave-soldering contact strips onto electronic supports, making it possible to connect the support in question to another support (mention may here be made of the example of a hybrid circuit or of a printed circuit which is to be inserted using these contacts into a printed circuit, or a hybrid or printed circuit which can be plugged, using this connection edge, into a connector).

The role of the fluxing is then to prepare the metallic surfaces to be soldered (performing actions such as degreasing, deoxidation, decontamination of adsorbed layers or other surface preparation), this being with the aim of facilitating the subsequent wetting of these surfaces by the solder, and also to eliminate oxides which might form thermally on the soldering alloy.

This fluxing operation is most commonly carried out using chemical fluxes which are often obtained from resin bases, supplemented in particular by acidic compounds. After soldering, flux residues remain on the article, often requiring the manufacturer to carry out a cleaning operation, most often using chlorinated solvents, which cleaning operation is highly controversial, in the context of the "Montreal Protocol" and its subsequent revisions, which very strictly regulate or even, in the case of some, depending on the countries, completely prohibit such solvents.

The design of wave soldering machines is such that the articles to be soldered are brought into contact with one or more waves of liquid solder which are obtained by circulation of the solder bath contained in a vat through one or more nozzles.

The articles (for example the circuits to which components have been attached) have generally been fluxed beforehand in an upstream zone of the machine, using a flux spray or a flux foam, the fluxing operation being generally followed by a preheating operation which is carried out in order to activate the fluxes previously deposited on the circuit and in order to preheat the circuits before they reach the hot soldering zone. A conveyor system is present for moving the articles from one zone of the machine to another.

(ii) Description of the Related Art

The problem of cleaning the objects after soldering has prompted many research efforts throughout the world over the past few years in order to try to provide a solution replacing the use of these compounds.

Among the solutions envisaged, mention may be made of dry fluxing methods such as plasma fluxing of surfaces before soldering, thereby avoiding using chemical fluxes and therefore the actual requirement of a downstream cleaning operation. The mixtures envisaged use, in particular, hydrogen.

In this field, mention may be made of document EP-A-0,427,020, which proposes treating the assembly parts to be soldered using a plasma of a process gas, recommending the use of low pressures for this treatment "with the aim of avoiding thermal damage to the assembly parts". All the examples given, in conjunction with the figures provided, relate to pressure conditions varying in the range of 30–100 Pa.

The same comment can be made in regard of document EP-A-0,371,693, which relates to a method of cleaning metallic surfaces before soldering using microwave plasma containing hydrogen. Here again, it is recommended to use low pressures "in order to make it possible to limit the level of residual oxygen in the plasma".

This consensus of opinion in favor of the use of low pressure conditions for carrying out this plasma fluxing operations, despite the drawbacks which are in particular linked with the cost of obtaining such pressures or else with the difficulty of installing the corresponding infrastructures in a production line, is undoubtedly linked with the technical and technological difficulty of obtaining, at atmospheric pressure, plasmas which give performance comparable to that which is traditionally obtained at low pressure.

In this context, the Applicant Company proposed, in document FR-A-2,697,456, a method for plasma fluxing metallic surfaces before soldering, at atmospheric pressure and using, in order to create the plasma, a microwave source or else a dielectric-barrier discharge transferred via slots placed suitably in a dielectric layer placed above the article to be treated. Although this document provides an advantageous solution to the problem in question, the Applicant Company has demonstrated the fact that the proposed method might be improved, especially as regards:

- its efficiency (ratio of power input for creating the plasma to the density of species produced which actually interact with the support to be treated), or else the permissible power density (in the case of dielectric-barrier discharge, it reaches only a few W per $cm^2$ of dielectric), which, if they were to be enhanced, might permit shorter treatment times,
- and also the fact of limiting "geometrical" factors: in the case of corona discharge, the electrode/sample distance is highly critical and must be kept very small, which may cause a problem in the case of substrates whose surface structure is relatively convoluted; in the case of microwave discharge, it gives rise to the formation of a plasma-generating spot which has defined dimensions limited by the plasma source,
- moreover, a plasma as created in this document contains, by definition, ionic species and electrons (and therefore electrically charged species) which are always difficult to use on electronic components.

Continuing its work on this subject, the Applicant Company then more recently proposed, in the French patent application published on 16 Jun. 1995 under U.S. Pat. No. 2,713,528, an improved method for dry fluxing of a metallic surface before soldering or tinning using an alloy, which is noteworthy in that it employs the following steps:

a) an initial gas mixture comprising an inert gas and/or a reducing gas and/or an oxidizing gas is passed through at least one apparatus for forming excited or unstable gas species, in order to obtain a primary gas mixture at the outlet of the apparatus;

b) the surface to be fluxed is treated, at a pressure close to atmospheric pressure, with a gaseous treatment atmosphere comprising excited or unstable species and substantially free of electrically charged species which is obtained from the primary gas mixture in question.

The examples developed in this document clearly demonstrated that it is possible, using this method, in particular:

to operate substantially at atmospheric pressure, to obtain a high degree of flexibility as regards the distance between the object to be treated and the device used for carrying out this treatment, to avoid contact of the articles with the charged species, to offer an improved power density, making it possible to achieve an enhanced treatment rate.

The treatment atmosphere which is obtained from the primary gas mixture, itself obtained at the gas outlet of an apparatus for forming excited or unstable gas species, may furthermore according to this document also comprise, if appropriate, an adjacent gas mixture which has not passed through the apparatus.

This configuration can therefore be termed "post-discharge" since the primary component of the treatment atmosphere, which comprises excited or unstable gas species, is obtained at the outlet of the apparatus, which ensures substantial absence of any electrically charged species in this primary component. The adjacent component of the treatment atmosphere, which has not passed through the apparatus, is a fortiori free of such species.

This configuration furthermore makes it possible clearly to dissociate the site of generation of the primary component of the atmosphere from the site at which it is used, which has a not inconsiderable advantage in terms of contamination of the apparatus (preventing the various releases resulting from the operation of fluxing the surface from contaminating the interior of the apparatus, for example its electrodes), and also in terms of reproducibility of the atmosphere encountered by the article.

Finally, the article, which is not treated within the apparatus (for example within a discharge between the electrodes), benefits from much better flexibility with regard to the "distance" aspect mentioned above.

In this document, this method was more particularly exemplified and illustrated with the aid of a particular device for forming excited or unstable gas molecules, operating substantially at atmospheric pressure, which the Applicant Company had previously developed and which is described in document FR-A-2,692,730.

SUMMARY AND OBJECTS OF THE INVENTION

The Applicant Company has since continued its work on this subject, with a view to further improving the method for dry fluxing a metallic surface before soldering or tinning according to document FR-2,713,528, and in particular its adaptation to the specific case of wave soldering, in which double-sided circuits, equipped with electronic components of the "surface-mounted" and of the "wire-bonded" type sometimes need to be soldered. This work has made it possible to demonstrate that when replacing chemical fluxing with dry fluxing, the soldering of wired components raises significant difficulties, giving rise in this case to the observation of defects due to the solder rising in the metallized holes.

This work has made it possible to demonstrate that, in the case of wave soldering, it is particularly advantageous to bring each face of the circuit into contact, upstream of the solder bath, with the primary gas mixture obtained at the gas outlet of at least one apparatus for forming excited or unstable gas molecules, the upper face of the circuit being preferably brought into contact with the gas outlets of at least two apparatuses for forming excited or unstable gas molecules, arranged in series.

The method for wave soldering a circuit, according to the present invention, during which the circuit is brought into contact with at least one wave of a liquid soldering alloy, this wave being obtained by pumping a liquid bath of the alloy contained in a vat, through at least one nozzle, is characterized in that each of the faces of the circuit has previously been brought, at a pressure close to atmospheric pressure, in front of the gas outlet of at least one apparatus for forming excited or unstable gas species, through which an initial gas mixture comprising an inert gas and/or a reducing gas and/or an oxidizing gas is passed, in order to obtain, after conversion, at the gas outlet of the apparatus, a primary gas mixture comprising excited or unstable gas species and substantially free of electrically charged species.

Advantageously, the upper face of the circuit is successively brought in front of the gas outlets of at least two apparatuses for forming excited or unstable gas species, arranged in series.

The "circuit" according to the invention may consist of any assembly which may be involved in such soldering operations, such as an electronic circuit onto which components have been attached with a view to soldering them (whether they are inserted components or surface-mounted components) or a contact strip/electronic support pairing (soldering the strip onto the support).

The "alloy" according to the invention will consist of any composition which may be envisaged for such an operation, such as, for example, Sn-Pb, Sn-Pb-Ag, etc.

According to the invention, the term "pressure close to atmospheric pressure" is intended to mean a pressure advantageously lying in the range $[0.1 \times 10^5$ Pa, $3 \times 10^5$ Pa$]$ and therefore between approximately 0.1 and 3 bar.

According to the invention, the term "electrically charged species" is intended to mean ions or electrons. The treatment atmosphere encountered by the circuit and obtained from the primary mixture is therefore distinguished from the plasma atmospheres used in the prior art literature in that it is substantially free of electrically charged species, that is to say ions or electrons.

The atmosphere for treating the circuit, which is obtained from the primary gas mixture, may also comprise, if appropriate, an adjacent gas mixture, the primary gas mixture being obtained at the gas outlet of the apparatus for forming excited or unstable gas species in which the initial gas mixture has been converted, whereas the adjacent gas mixture has not itself passed through the apparatus.

As previously developed in the paragraph given over to document FR-2,713,528, this configuration can be termed "post-discharge", with all the advantages which result therefrom and which have already been listed.

The inert gas may, for example, consist of nitrogen, argon, helium or a mixture of such inert gases. The reducing gas may, for example, consist of hydrogen, $CH_4$ or else ammonia or a mixture of such reducing gases. The oxidizing gas may, for its part, for example consist of oxygen or $CO_2$ or else $N_2O$, $H_2O$ or a mixture of such oxidizing gases. The list of gases given in each category is, of course, only an indication and implies no limitation.

The apparatus according to the invention consists of any device making it possible to "excite" an initial gas mixture in order to obtain, at the gas exit of the apparatus, another gas mixture (here referred to as the primary gas mixture) including unstable or excited gas species, the latter gas mixture being substantially free of electrically charged species. Such excitation may, for example, be obtained by electric discharge, for example of the corona discharge type.

Document FR-A-2,692,730, in the name of the Applicant Company, which was mentioned above describes an apparatus for forming excited or unstable gas molecules which is suitable for implementing the method according to the present invention.

The adjacent gas mixture according to the invention may consist of any gas or gas mixture, for example an inert gas or mixture of inert gases making it possible to maintain, if appropriate, a protective atmosphere around the samples, or else a reducing gas or an oxidizing gas, or even a mixture of gases belonging to one of these three categories.

According to one of the aspects of the invention, the adjacent gas mixture contains silane $SiH_4$. The presence of such an adjacent mixture containing silane is advantageously used for its reducing action with regard to certain metal oxides present on the surface of the article to be treated and also, depending on the initial gas mixture used, as an oxygen "getter" (or trap), that is to say in its interaction with the residual oxygen in the atmosphere present above the circuit, with the aim of reducing this level of residual oxygen to a minimum, when this is deemed necessary.

According to another aspect of the invention, during the time in which the circuit is in front of the gas outlet of at least one of the apparatuses, the circuit is heated to a temperature of between ambient temperature and the melting temperature of the alloy used in order to carry out the subsequent wave soldering operation. This upper limit will therefore depend on the alloy used, and it will, for example, lie in the vicinity of 180° C. in the case of the Sn63-Pb37 or Sn62-Pb36-Ag2 alloys conventionally used. Advantageously, and depending on the particular type of article or support treated, in order to limit the growth of intermetallics, efforts will be made to adopt a temperature which is not too close to the melting temperature of the alloy used, for example not exceeding 160° C. in the case of Sn63-Pb37 or Sn62-Pb36-Ag2 alloys.

According to one of the aspects of the invention, the circuit is brought in front of the gas outlets of the apparatuses by a conveyor system which passes through an internal space which is bounded by a covering structure (for example a tunnel or a set of elementary coverings or hoods) and is isolated from the surrounding atmosphere, the structure being connected in a leaktight manner to the apparatuses or including the apparatuses.

According to one of the embodiments of the invention, at least one of the apparatuses in which an initial gas mixture is converted is the seat of an electric discharge created between a first electrode and a second electrode, a layer of a dielectric material being arranged on the surface of at least one of the electrodes, facing the other electrode, with the initial gas mixture converted in this apparatus passing through the discharge transversely to the electrodes.

The power used in the apparatus, per unit surface area of dielectric, will then advantageously be greater than or equal to 1 $W/cm^2$, preferably greater than or equal to 10 $W/cm^2$, and most often lying in the range [10 $W/cm^2$, 100 $W/cm^2$].

According to one of the embodiments of the invention, the initial gas mixture converted in at least one of the apparatuses comprises water vapour, and the water vapour content of the initial gas mixture in question, which comprises water vapour, is then advantageously in the range [50 ppm, 6%], preferably in the range [100 ppm, 1%], and more preferably in the range [500 ppm, 5000 ppm].

According to another of the embodiments of the invention, the initial gas mixture converted in at least one of the apparatuses comprises oxygen. In the latter case, the oxygen content of the initial gas mixture is advantageously kept below a few hundreds of ppm.

According to another of the embodiments of the invention, the initial gas mixture converted in at least one of the apparatuses consists of a nitrogen/hydrogen/water vapor mixture.

According to another of the embodiments of the invention, the initial gas mixture converted in at least one of the apparatuses consists of a nitrogen/hydrogen/water vapour/oxygen mixture.

According to one of the embodiments of the invention, the initial gas mixture converted in at least one of the apparatuses comprises hydrogen, and its hydrogen content will then advantageously lie in the range [1000 ppm, 50%], and preferably less than or equal to 10%.

According to one of the embodiments of the invention, the atmosphere successively encountered by the circuit along the conveyor is zoned in the following manner:

a) at least one of the apparatuses for forming excited or unstable gas species converts a different initial gas mixture from that converted by the apparatus preceding it in the said structure, and/or b) the adjacent gas mixture employed in at least one of the apparatuses for forming excited or unstable gas species is different from that employed in the apparatus preceding it in the said structure.

According to one of the embodiments of the invention, steps a) and b) above may relate to one and the same apparatus.

According to one of the aspects of the invention, upstream or downstream of the group of apparatuses encountered by the circuit (and therefore of the treatment operation which this group carries out), the circuit is subjected to a preheating operation, it is thus, for example, possible to carry out the following successions of steps:

a treatment (fluxing) according to the invention (cold or hot) followed by a preheating operation (followed by soldering);

a preheating operation followed by a treatment according to the invention (cold or hot) (followed by soldering);

a treatment according to the invention (cold), followed by a preheating operation, followed by another treatment according to the invention (hot) (followed by soldering), this list of successions being, of course, only an illustration of the numerous possibilities afforded by the invention.

After the circuit has been brought into contact with the solder wave or waves, that is to say downstream of the soldering operation proper, at least one of the faces of the circuit may, if appropriate, be brought in front of the gas outlet of at least one apparatus (which may be referred to as "downstream") for forming excited or unstable gas species, through which an initial gas mixture (which may here again be referred to as "downstream") comprising an inert gas and/or a reducing gas and/or an oxidizing gas is passed, in order to obtain, at the gas outlet of the apparatus, a downstream primary gas mixture comprising excited or unstable gas species and substantially free of electrically charged species, this making it possible, if necessary, to carry out after-cleaning of the surface of the circuit.

It is also possible to envisage that, during all or part of the contact with the solder wave or waves, at least one of the faces of the circuit is brought into contact with the gas outlet of at least one apparatus, which may be referred to as "additional", for forming excited or unstable gas species, through which an initial gas mixture (which may also be referred to as "additional") comprising an inert gas and/or a reducing gas and/or an oxidizing gas is passed, in order to obtain, at the gas outlet of the apparatus, an "additional" primary gas mixture comprising excited or unstable gas species and substantially free of electrically charged species.

As will be clearly apparent to the person skilled in the art, this "additional" treatment, carried out during the actual soldering, may appear highly advantageous with a view, in particular, to substantially eliminating the oxides which could form on the soldering alloy.

According to one aspect of the invention, provision is made to set up a regime which may be referred to as "waiting" of the treatment carried out before soldering, when the soldering operation has to be temporarily interrupted.

Provision may thus, according to the invention, be made for situations in which, for example as a result of an intentional action by the user, or because no circuit has been detected at the entry of the structure during a period of time which has been predetermined, at least one of the following measures is initiated:

- the supply of primary gas mixture to each apparatus is stopped;
- a reduced flow rate of the primary gas mixture which circulated in the apparatus in question (for example a few % of a few tens of % of the flow rate circulating in the nominal regime used for the treatment) is maintained in each apparatus;
- when an adjacent gas mixture is employed in at least one of the apparatuses, the supply of adjacent gas mixture at at least one of these apparatuses is stopped;
- instead of the primary gas mixture which circulates in the apparatus in question, a primary gas mixture which may be referred to as standby (for example a neutral gas or else a neutral gas/hydrogen mixture, etc.) is passed through each apparatus;
- each apparatus is switched from the treatment regime which it was in to a standby regime in which the power density used therein is only a few W/cm$^2$.

The invention also relates to a device for wave soldering circuits using a liquid alloy, comprising:

- a covering structure bounding an internal space through which means for conveying the circuits pass, which is isolated from the surrounding atmosphere and which defines a path for conveying the circuits inside the structure,
- at least two apparatuses for forming excited or unstable gas species, mounted in series, comprising at least one tubular gas passage which has an axis and is formed between an outer electrode and an inner electrode, at least one of the electrodes having, facing the other, a dielectric coating, the electrodes being connected to a high-voltage and high-frequency source, the outer electrode surrounding the dielectric and having at least one inlet for so-called initial gas and at least one outlet for so-called primary gas, which are elongated, parallel to the axis and substantially diametrically opposite, the said gas outlet opening inside the said structure, the said structure surrounding or being connected in a leaktight manner to the apparatuses,
- at least one of the apparatuses being located above the path, at least one other of the apparatuses being located below the path, and
- a vat suitable for containing a bath of the alloy, located downstream of the structure (and therefore outside the structure), or else located downstream of the said apparatuses, in which case the said structure surrounds or is connected in a leaktight manner to the vat.

According to one of the embodiments of the invention, the structure is equipped with at least one means for injecting a so-called adjacent gas which does not pass through at least one of the said apparatuses.

According to one aspect of the invention, the device includes, upstream or downstream of the apparatuses, means for heating the circuits.

Other characteristics and advantages of the present invention will emerge from the following description of embodiments which is given by way of illustration but without implying any limitation, and made with reference to the appended drawings, in which:

DETAILED DESCRIPTION OF PREFERRED EMBODIMENTS

Figure 1:
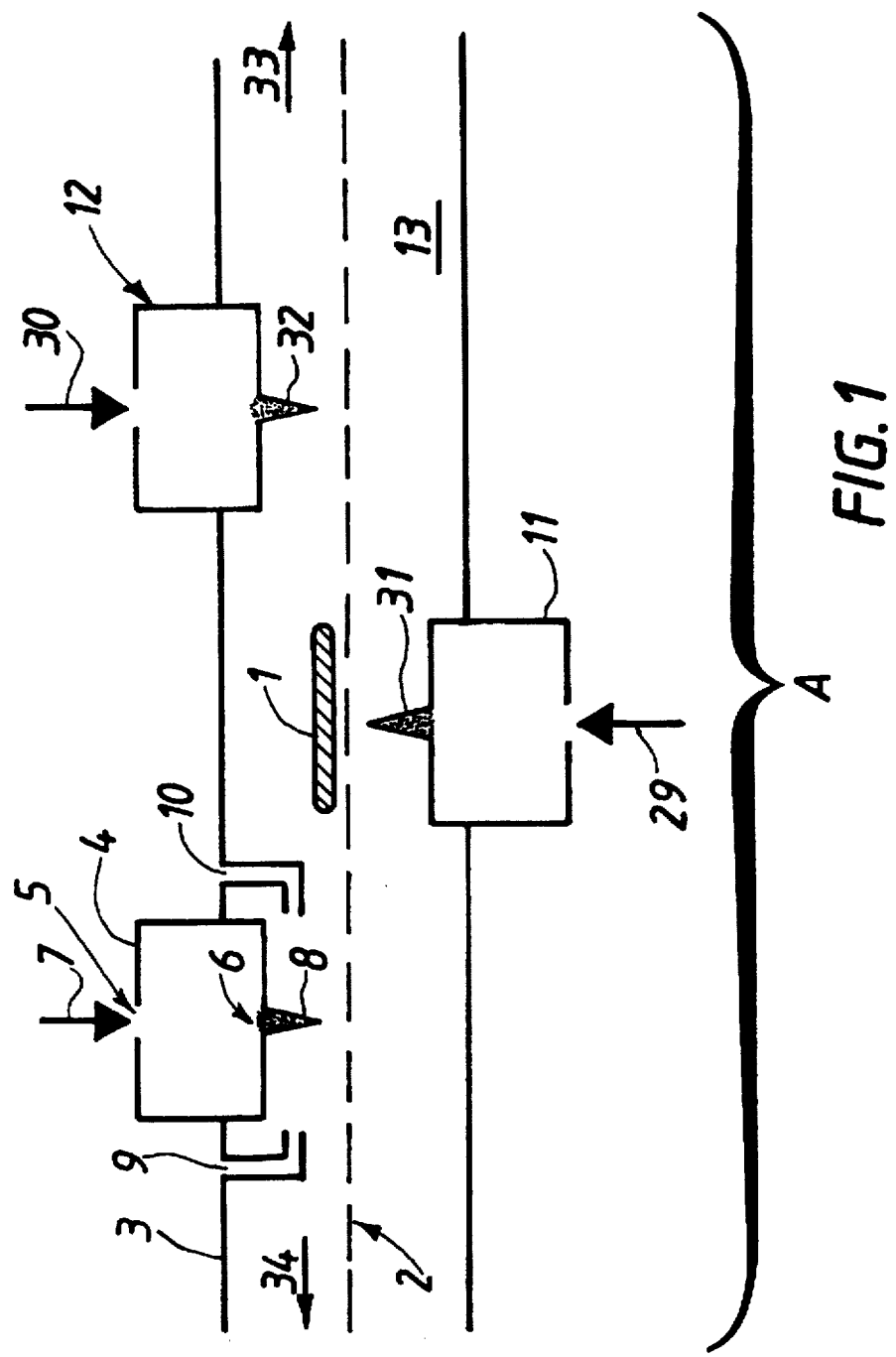
FIG. 1 is a schematic view of a covering structure according to the invention, which is connected to three apparatuses for forming excited or unstable gas species, suitable for implementing the method according to the invention.

FIG. 1 shows the presence of a circuit 1 to be soldered (represented by a single thickness, the electronic components not having been represented in this figure), brought using a conveyor system (not shown for reasons of clarity) (for example of the type including two chains of fingers gripping the circuit on either side of the tunnel), along a conveying path 2, in front of the gas outlets of three apparatuses 4, 11, 12 for forming excited or unstable gas species. The gas outlet of the first apparatus has been referenced 6.

The conveying path 2 passes through an internal space 13, bounded by a covering structure 3 (here a tunnel), advantageously connected in a leaktight manner to the apparatuses.

At 8, 31, 32 are schematically shown the primary gas mixtures obtained at the gas outlets of the apparatuses successively encountered by the circuit and obtained by conversion in each apparatus, respectively, of the initial mixtures 7, 29 and 30.

The gas inlet of the apparatus 4 has been referenced 5.

The presence is also noted in the embodiment represented in FIG. 1 of inlets 9, 10 for adjacent gas mixtures at the apparatus 4.

The installation is furthermore provided, if required, with a means (not shown in FIG. 1) for heating the circuit 1. Infrared lamps present in the tunnel or convection heating (hot tunnel walls) or else the fact that the article is placed on a heating substrate holder may, for example, be envisaged for this heating means.

The structure in FIG. 1 has been represented independently of any wave soldering machine, but, as broadly developed above, numerous possible arrangements of this structure may be envisaged:

- the fact that, for example, at the exit of this tunnel structure 3, the circuit enters a wave soldering machine (direction referenced 33), the circuit being, if appropriate, being kept under a protective atmosphere between the exit of the tunnel and the entry of the machine;

or else the fact that the treatment according to the invention and the soldering operation are carried out within the same tunnel structure 3 (the solder vat then being located downstream of the last apparatus which is encountered, here 12). The direction of the entry of the structure has therefore been symbolized by the reference 34 and the direction of the location of the solder bath by the reference 33.

As detailed above, the assembly A consisting of the tunnel portion incorporating the three apparatuses 4, 12, 11 for forming excited or unstable gas species will then necessarily be located upstream of the solder bath, but may, depending on the case, be located upstream or downstream of a step of preheating the circuits.

As will be clearly apparent to the person skilled in the art, although FIG. 1 illustrates a particular configuration of the respective positions of the apparatuses, all configurations of spacing between the apparatuses may be envisaged according to the invention, including the fact that two apparatuses may be located one above the other.

Figure 2:
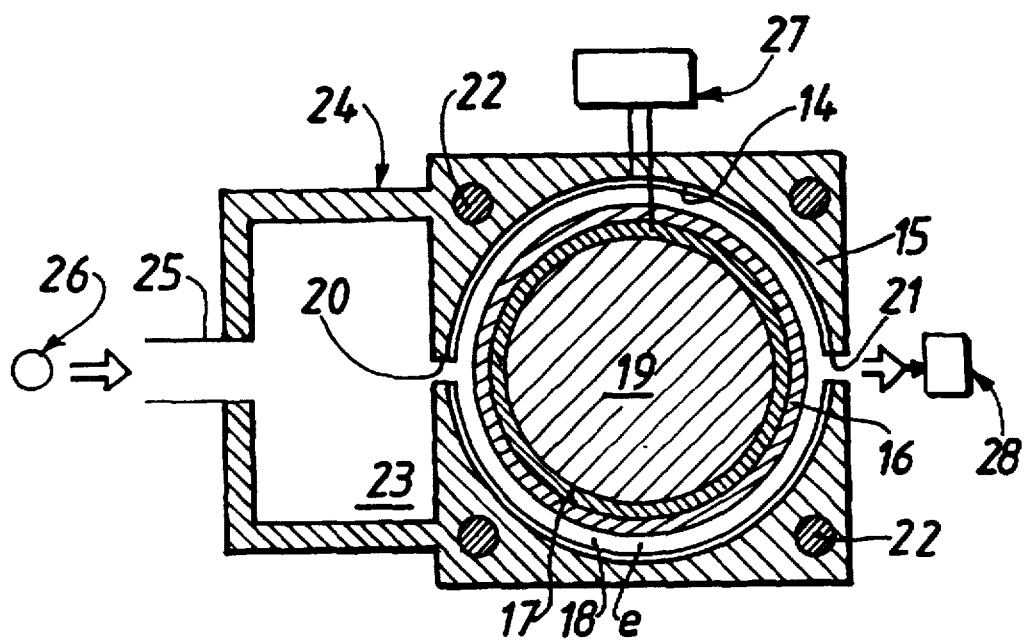
FIG. 2 schematically represents, in section, an example of an apparatus for forming excited or unstable gas species, suitable for implementing the method according to the invention.

As represented in the embodiment of FIG. 2, the apparatus for this embodiment is of cylindrical geometry and comprises a first tubular electrode 14, formed for example by an internal face of a metallic block 15, in which an assembly comprising a tube 16 of dielectric material, for example made of ceramic, is placed concentrically, a second electrode 17 whose thickness is exaggerated for clarity in FIG. 2 being deposited by metallization on the internal face of the dielectric tube.

The assembly comprising the dielectric 16 and the second electrode 17 thus bounds, with the first electrode 14, a tubular gas passage 18 and, internally, an internal volume 19 in which a coolant is circulated, advantageously a Freon for its electronegative character or else deionized water. The internal gas passage 18 has an axial extent of less than 1 m, typically less than 50 cm, and its radial thickness e does not exceed 3 mm and is typically less than 2.5 mm.

The block 15 includes two diametrically opposite longitudinal slots 20 and 21 respectively forming the inlet for the initial gas to be excited in the passage 18 and the outlet for the primary gas flux containing the excited or unstable gas species.

The slots 20 and 21 extend over the entire axial length of the cavity 21 and have a width which, in the case of the embodiment represented in FIG. 2, does not exceed the thickness e and is typically substantially identical to the latter (other configurations could be envisaged, such as, for example, a width slightly greater than the thickness e). The body 15 advantageously includes, at the periphery of the first electrode 14, a plurality of ducts 22 for passage of a coolant, for example water. The gas inlet 20 communicates with a homogenization chamber or plenum 23 formed in a casing 24 attached to the block 15 and including a tube 25 for supplying initial gas from an initial gas source 26 and therefore at a pressure which may vary, depending on this source, typically from a few bar to 100 or 200 bar. The electrodes 14 and 17 are connected to a high-voltage and high-frequency electrical generator 27 operating at a frequency advantageously greater than 15 kHz and delivering a power of, for example, the order of 10 kW. It may furthermore be advantageous to express this power delivered by the generator by normalizing it per unit surface area of dielectric.

The gas flux containing the excited species which is available at the gas outlet 21 is sent to a user station 28, for example for fluxing metallic surfaces.

Figure 3:
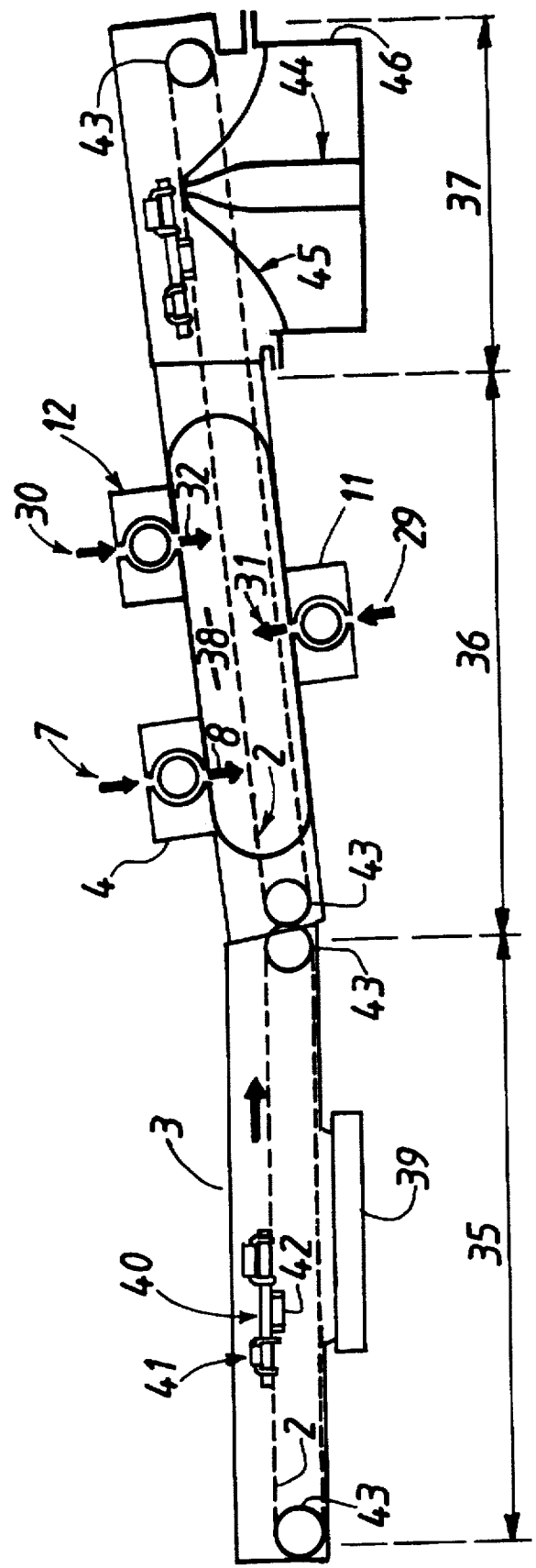
FIG. 3 is a schematic representation of a wave soldering device (machine) suitable for implementing the method according to the invention.

FIG. 3 schematically illustrates one of the embodiments of a wave soldering machine according to the invention.

This machine may be divided into three zones:

a zone 35 for preheating the circuits (using means 39 located in the lower part of this zone), a zone 36 for treating the circuits before soldering (using three apparatuses 4, 12, 11, the apparatuses 4 and 12 being located in front of the upper face of each circuit which passes through the machine, whereas the apparatus 11 is located in front of its lower face), a zone 37 for wave soldering (the wave being formed by pumping a bath of solder contained in a vat 46 through a nozzle 44).

The circuit 40 (onto which electronic components of the wire-bonded type 41 and surface-mounted type 42 have been attached) passes from one zone of the machine to the next, the machine being tunnelled 3 over its entire length, with the aid of a conveyor system including two chains of fingers which grip the circuit on either side of the tunnel. The figure represents merely the path 2 along which the circuits are conveyed inside the machine, together with the systems 43 which move the conveyor chains.

Between the preheating zone and the soldering zone, each circuit undergoes a treatment by being successively brought into contact with the primary gas mixtures obtained at the gas outlets of the apparatuses 4 (circuit upper face), then 11 (circuit lower face) and finally 12 (upper face again).

No adjacent mixture inlet in the tunnel has been mentioned for this embodiment.

The reference 38 schematically represents the treatment atmosphere encountered by the circuit in this zone.

A device such as that described with reference to FIG. 3, incorporating three apparatuses such as that described with reference to FIG. 2, was used for carrying out examples of implementation of the invention.

The common implementation conditions of these examples are as follows:

each apparatus uses a power of the order of 3 kW, corresponding to a power density of the order of 35 W/cm$^2$;

the preheating zone maintains a temperature at the circuits of the order of 150° to 1600° C., the speed at which the circuits are conveyed in the zone 36:8 cm/min, at each of the three apparatuses, the circuit is heated (temperature of the circuits maintained at a level of the order of 150° to 160° C.) by the presence, opposite each apparatus, of a radiation tube (at each apparatus, the circuit is therefore "sandwiched" between the apparatus and a radiating tube, not shown in FIG. 3), the circuits tested were of the printed circuit (PCB) type, pretinned, double sided with metallized holes and including components in the two categories "surface mounted" and "wire bonded";

for each example, the number of soldering defects on the wired components which are particularly difficult to treat (defect of solder rising in the metallized holes) is counted for each circuit soldered. Each example therefore gives the average of the number of defects observed per board, for at least 10 soldered boards, with a knowledge of the fact that one board includes 100 soldering points of the "metallized hole" type.

For the first example of implementation, the operating conditions and the results obtained are as follows:

initial mixture converted in the first and second apparatuses: 17 m$^3$/h of an N$_2$/H$_2$ mixture with 4% of hydrogen;

initial mixture converted in the third apparatus (12): 17 m³/h of an $N_2/H_2/H_2O$ mixture with 4% of hydrogen and 1000 ppm of $H_2O$.

average defect rate: <10%

For the comparative second example, only one apparatus (11) was used in the zone 36, in front of the lower face of the circuit.

For the type of circuit treated, the rate of defects for the particular soldering points constituted by the metallized holes was close to 60%, regardless of whether the initial mixture treated in the single apparatus was the $N_2/H_2/H_2O$ mixture used in Example 1 or an $N_2/H_2$ mixture with 4% of hydrogen.

The results described above illustrate the very substantial improvement in the results observed on the points of the circuit which are most difficult to solder (wired components, metallized holes) by using at least one apparatus in front of each face of the circuit, here, specifically, two apparatuses in front of the upper face.

The results obtained using a single apparatus at the upper face (in addition to the apparatus located at the lower face) did indeed prove satisfactory for the circuit tested, but made it necessary to reduce the rate of advance of the circuit under the apparatus (in comparison with the rate of advance which can be used when two apparatuses are positioned at the upper face). It will therefore be understood that it is necessary to find the best compromise depending on the case of each user (circuits treated, desired productivity, etc.).

Although the present invention has been described with reference to particular embodiments, it is in no way limited thereby but, on the contrary, is susceptible of modifications and variants which will be apparent to the person skilled in the art in the context of the claims hereinbelow.

We claim:

1. A method for wave soldering a circuit having two or more faces comprising the steps of:
    (i) passing at least one initial gas mixture comprising at least one of an inert gas, a reducing gas and an oxidizing gas into at least one apparatus for forming excited or unstable gas species;
    (ii) converting said at least one initial gas mixture into at least one primary gas mixture comprising excited or unstable gas species and substantially free of electrically charged species;
    (iii) treating each of the two or more faces of said circuit with said at least one primary gas mixture at a pressure close to atmospheric pressure; and
    (iv) contacting said two or more faces of said circuit with at least one wave of a liquid soldering alloy.

2. The method of claim 1 wherein said contacting step (iv) comprises pumping a liquid bath of the alloy through at least one nozzle.

3. The method of claim 1 wherein said at least one apparatus includes a gas outlet and wherein said circuit is brought in front of said gas outlet.

4. The method according to claim 1 wherein at least two apparatuses are employed to produce at least two primary gas mixtures and wherein said circuit has an upper face which is successively treated in series with said at least two primary gas mixtures.

5. The method according to claim 1 wherein said treating step (iii) is carried out with two or more primary gas mixtures from two or more apparatuses, the method further comprising the step of conveying said circuit to be treated with a conveyor through an internal space which is isolated from a surrounding atmosphere, said internal space being connected in a leaktight manner to said apparatuses or including said apparatuses.

6. The method according to claim 5 further comprising transporting said circuit from said internal space to a machine wherein said contacting step (iv) with the liquid solder wave or waves takes place and optionally keeping the circuit under a protective atmosphere between an exit of said internal space and an entry of said machine.

7. The method according to claim 5 wherein said step (iv) of contacting said circuit with at least one wave of a liquid soldering alloy takes place within said internal space downstream of said apparatuses.

8. The method according to claim 1 further comprising the step of heating said circuit to a temperature of between ambient temperature and a melting temperature of said alloy during said step (iii) of treating said circuit with said at least one primary gas mixture.

9. The method according to claim 8 wherein the melting temperature of said alloy is close to 180° C. and said temperature to which the circuit is heated does not exceed 160° C.

10. The method according to claim 1 further comprising the step of preheating said circuit upstream or downstream of said at least one apparatus.

11. The method according to claim 1 wherein said at least one initial gas mixture comprises between about 100 ppm and 1% water vapor.

12. The method according to claim 11 wherein said at least one initial gas mixture comprises between about 500 ppm and 5000 ppm water vapor.

13. The method according to claim 1 wherein said at least one initial gas mixture comprises oxygen.

14. The method according to claim 1 wherein said at least one initial gas mixture comprises a nitrogen/hydrogen/water vapor mixture.

15. The method according to claim 13 wherein said at least one initial gas mixture comprises a nitrogen/hydrogen/water vapor/oxygen mixture.

16. The method according to claim 1 wherein said at least one initial gas mixture comprises between about 1000 ppm to 50% hydrogen.

17. The method according to claim 1 wherein said at least one initial gas mixture comprises less than or equal to about 10% hydrogen.

18. The method according to claim 1 wherein said at least one apparatus is a seat of an electric discharge created between a first electrode and a second electrode, at least one of the first and second electrodes including a dielectric material arranged on its surface and facing the other electrode, wherein said at least one initial gas mixture is passed through the discharge transversely to the electrode.

19. The method according to claim 18 wherein said apparatus uses greater than or equal to about 1 W/cm² of power, normalized per unit surface area of dielectric.

20. The method according to claim 19 wherein said apparatus uses greater than or equal to about 10 W/cm².

21. The method according to claim 5 wherein at least one of the apparatuses for forming excited or unstable gas species converts a different initial gas mixture from that converted by the apparatus which precedes it.

22. The method according to claim 1 wherein, in at least one of the apparatuses, said circuit is treated with a gaseous treatment atmosphere comprising (a) said primary gas mixture from said at least one apparatus and (b) an adjacent gas mixture which has not passed through said at least one apparatus.

23. The method according to claim 22 wherein said adjacent mixture includes silane $SiH_4$.

24. The method according to claim 5 wherein, in at least one of the apparatuses, said circuit is treated with a gaseous treatment atmosphere comprising said primary gas mixture from said at least one apparatus and an adjacent gas mixture which has not passed through said at least one apparatus, and where said process further comprises the step of conveying said circuit successively through an atmosphere zoned as follows:

a) at least one of said apparatuses converts a different initial gas mixture from that converted by a preceding apparatus;

b) the adjacent gas mixture employed in at least one of the apparatuses is different from that employed in the apparatus preceding it.

25. The method according to claim 24 wherein said steps a) and b) take place within a single apparatus.

26. The method according to claim 1 further comprising, downstream of the said step (iv) of contacting said circuit with said solder wave or waves, the step of treating at least one of the faces of the circuit with an additional primary gas mixture.

27. The method according to claim 1 further comprising, during said step (iv) of contacting all or part of said circuit with the solder wave or waves, the step of treating at least one of the faces of the circuit with an additional primary gas mixture.

28. The method according to claim 5 further comprising the step of detecting arrival of the circuit upstream of or at an entry of said internal space and, as a result of an intentional action by a user or because no circuit has been detected at the entry of said internal space during a predefined time period, initiating at least one of the following measures:

stopping supply of said primary gas mixture to each of said apparatuses;

maintaining a reduced flow rate of the primary gas mixture which circulates in said apparatus;

passing a standby primary gas mixture through each apparatus instead of the primary gas mixture.

29. The method according to claim 22 further comprising the step of detecting arrival of the circuit upstream of or at an entry of said internal space and, as a result of an intentional action by a user or because no circuit has been detected at the entry of said internal space during a predefined time period, stopping supply of said primary gas mixture to each of said apparatuses.

30. The method according to claim 18 further comprising the step of detecting arrival of the circuit upstream of or at an entry of said internal space and, as a result of an intentional action by a user or because no circuit has been detected at the entry of said internal space during a predefined time period, placing said electrodes in a standby regime in which power density used therein is only a few $W/cm^2$.

31. A device for wave soldering circuits using a liquid alloy, comprising:

a covering structure bounding an internal space through which means for conveying the circuits pass, which is isolated from a surrounding atmosphere and which defines a path for conveying the circuits inside the structure, at least two apparatuses for forming excited or unstable gas species, mounted in series, comprising at least one tubular gas passage which has an axis and is formed between an outer electrode and an inner electrode, at least one of the electrodes having, facing the other, a dielectric coating, the electrodes being connected to a high-voltage and high-frequency source, the outer electrode surrounding the dielectric and having an inlet for said initial gas and at least one outlet for said primary gas, which are elongated, parallel to the axis and substantially diametrically opposite, said gas outlet opening inside said structure, at least one of said apparatuses being located above said path, at least one other of said apparatuses being located below said path, said structure surrounding or being connected in a leaktight manner to the apparatuses, and a vat suitable for containing a bath of said alloy, located downstream of said structure, or else located downstream of said apparatuses, in which case the said structure surrounds or is connected in a leaktight manner to the vat.

32. The device according to claim 31 wherein said structure is equipped with at least one means for injecting an adjacent gas which does not pass through at least one of said apparatuses.

33. The device according to claim 31 further comprising, upstream or downstream of said apparatuses, means for heating the circuits.

* * * * *